United States Patent
Iimori et al.

(10) Patent No.: US 9,514,952 B2
(45) Date of Patent: Dec. 6, 2016

(54) METHOD OF MANUFACTURING SEMICONDUCTOR DEVICE AND SEMICONDUCTOR MANUFACTURING APPARATUS

(71) Applicant: KABUSHIKI KAISHA TOSHIBA, Minato-ku (JP)

(72) Inventors: Hiroyasu Iimori, Mie (JP); Takehiro Ogata, Kitakami (JP); Tomohiko Sugita, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/679,324

(22) Filed: Apr. 6, 2015

(65) Prior Publication Data
US 2016/0071738 A1    Mar. 10, 2016

(30) Foreign Application Priority Data
Sep. 8, 2014    (JP) .................................. 2014-182267

(51) Int. Cl.
| | | |
|---|---|---|
| *H01L 21/311* | (2006.01) | |
| *H01L 21/67* | (2006.01) | |
| *H01L 21/306* | (2006.01) | |

(52) U.S. Cl.
CPC .... *H01L 21/31111* (2013.01); *H01L 21/30604* (2013.01); *H01L 21/6708* (2013.01); *H01L 21/67017* (2013.01); *H01L 21/67253* (2013.01)

(58) Field of Classification Search
None
See application file for complete search history.

(56) References Cited

U.S. PATENT DOCUMENTS

| | | | | |
|---|---|---|---|---|
| 3,971,683 A | * | 7/1976 | Briska | ................... H01L 21/306 148/DIG. 43 |
| 4,921,572 A | * | 5/1990 | Roche | ............... H01L 21/31111 134/2 |
| 5,277,835 A | * | 1/1994 | Ohmi | ..................... C09K 13/08 252/79.3 |
| 5,357,803 A | * | 10/1994 | Lane | ................... G01P 15/0802 361/280 |
| 5,972,123 A | * | 10/1999 | Verhaverbeke | ......... C03C 15/00 134/1 |
| 6,369,008 B1 | | 4/2002 | Ha et al. | |
| 6,725,119 B1 | * | 4/2004 | Wake | ................ H01L 21/02063 134/1.3 |
| 6,799,589 B2 | | 10/2004 | Inagaki | |
| 2002/0059943 A1 | * | 5/2002 | Inagaki | .................... B08B 3/08 134/18 |
| 2004/0108299 A1 | | 6/2004 | Kikuyama et al. | |

(Continued)

FOREIGN PATENT DOCUMENTS

| | | |
|---|---|---|
| JP | 3-179737 | 8/1991 |
| JP | 9-22891 | 1/1997 |

(Continued)

*Primary Examiner* — Allan Olsen
(74) *Attorney, Agent, or Firm* — Oblon, McClelland, Maier & Neustadt, L.L.P.

(57) ABSTRACT

A method of manufacturing a semiconductor device includes processing a plurality of substrates each provided with an etch target by using a chemical liquid, the chemical liquid used repeatedly and being mixed with water for adjustment of an etch rate.

15 Claims, 10 Drawing Sheets

(56) References Cited

U.S. PATENT DOCUMENTS

| | | | | |
|---|---|---|---|---|
| 2004/0157452 | A1* | 8/2004 | Ogawa | H01L 21/31111 |
| | | | | 438/691 |
| 2005/0208774 | A1* | 9/2005 | Fukunaga | C23C 18/1619 |
| | | | | 438/745 |
| 2005/0230045 | A1* | 10/2005 | Okuchi | H01L 21/31111 |
| | | | | 156/345.18 |
| 2006/0137712 | A1* | 6/2006 | Wada | B08B 3/08 |
| | | | | 134/2 |
| 2010/0112821 | A1 | 5/2010 | Itano et al. | |
| 2011/0217833 | A1 | 9/2011 | Lee et al. | |

FOREIGN PATENT DOCUMENTS

| | | |
|---|---|---|
| JP | 10-177998 | 6/1998 |
| JP | 2000-31132 | 1/2000 |
| JP | 2001-127007 | 5/2001 |
| JP | 2001-267286 | 9/2001 |
| JP | 2002-143790 | 5/2002 |
| JP | 2004-200267 | 7/2004 |
| JP | 2005-336600 | 12/2005 |
| JP | 3891769 | 3/2007 |
| JP | 5251867 | 7/2013 |
| JP | 5400528 | 1/2014 |
| JP | 5423788 | 2/2014 |

\* cited by examiner

METHOD OF MANUFACTURING SEMICONDUCTOR DEVICE AND SEMICONDUCTOR MANUFACTURING APPARATUS

CROSS-REFERENCE TO RELATED APPLICATION(S)

This application is based upon and claims the benefit of priority from Japanese Patent Application No. 2014-182267, filed on, Sep. 8, 2014 the entire contents of which are incorporated herein by reference.

FIELD

Embodiments disclosed herein generally relate to a method of manufacturing a semiconductor device and a semiconductor manufacturing apparatus.

BACKGROUND

In a manufacturing process flow of a semiconductor device such as a NAND-type nonvolatile semiconductor storage device, a slimming process employing wet etching may be carried out to form fine patterns. The slimming process may require the etching to progress at a low etch rate and with high precision in order to form fine patterns. Thus, the etch rate is controlled so as not to vary significantly during wafer processing. It is however, difficult to control the etch rate with ease and at low cost when etching at low etch rates.

DESCRIPTION

Figure 1:
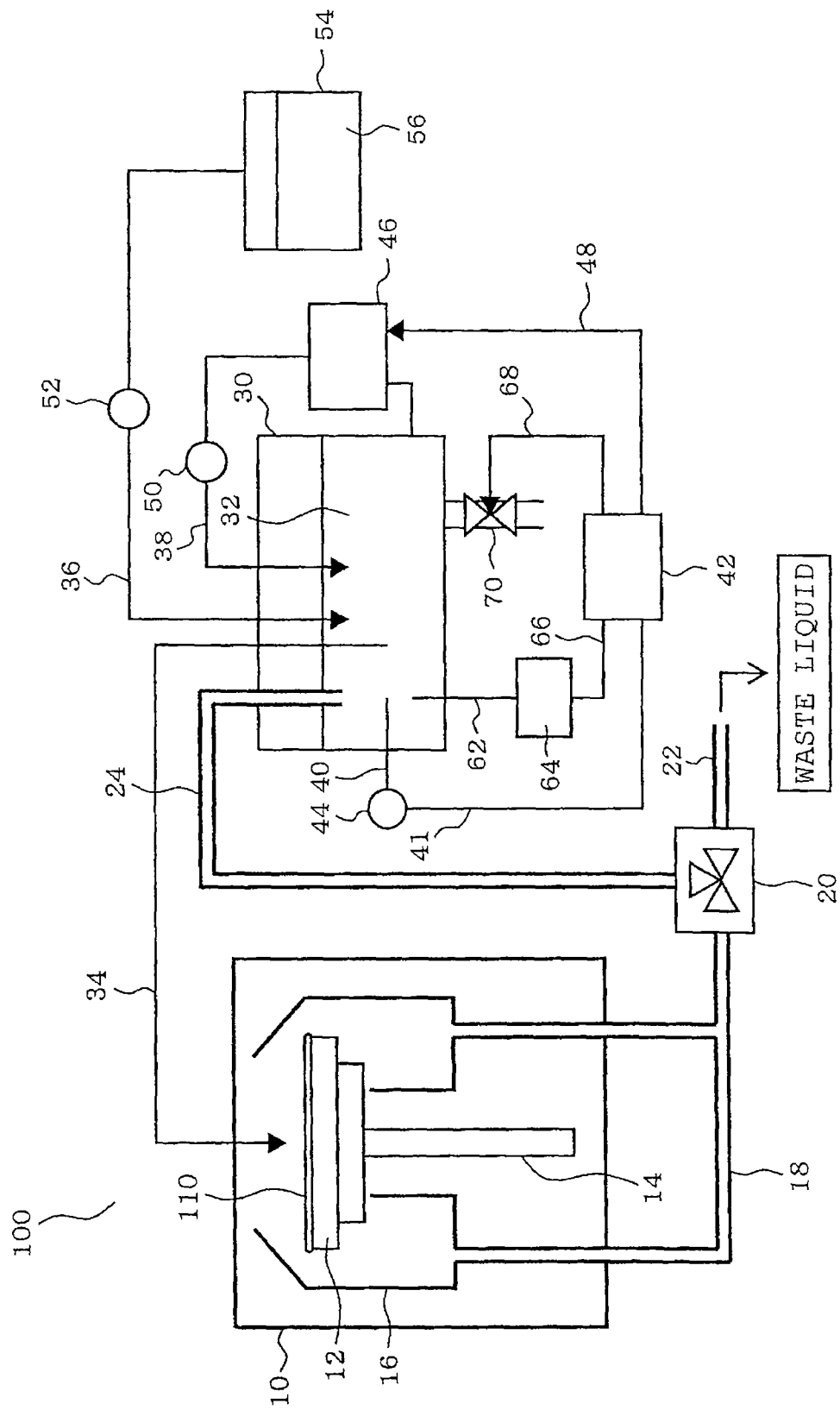
FIG. 1 pertains to a first embodiment and is one example of a block diagram illustrating a wet etch apparatus which is one example of a semiconductor manufacturing apparatus.

In one embodiment, a method of manufacturing a semiconductor device includes processing a plurality of substrates each provided with an etch target by using a chemical liquid, the chemical liquid used repeatedly and being mixed with water for adjustment of an etch rate.

In one embodiment, a semiconductor manufacturing apparatus includes a substrate processing portion configured to process a plurality of substrates each provided with an etch target using a chemical liquid; a chemical liquid storing portion configured to store a chemical liquid; and a chemical liquid cycling portion configured to be capable of returning the chemical liquid used in processing the substrate to the chemical liquid storing portion. The chemical liquid comprises a buffered hydrogen fluoride. An etch rate of the chemical liquid stored in the chemical liquid storing portion is controlled to fall within a predetermined range by being mixed with water.

EMBODIMENTS

Embodiments are described herein with reference to the accompanying drawings. The drawings are schematic and are not necessarily consistent with the actual relation between thickness and planar dimensions as well as the ratio of thicknesses between different layers, etc. The same element may be illustrated in different dimensions and ratios depending upon the figures. Elements once described in the specification and illustrated in the drawings or similar to those once described and illustrated are thereafter identified with identical reference symbols and may not be re-described.

First Embodiment

FIG. 1 pertains to a first embodiment and is one example of a block diagram illustrating the structures of a wet etch apparatus which is one example of a semiconductor manufacturing apparatus. As illustrated in FIG. 1, wet etch apparatus 100 is provided with wafer processing chamber 10 also referred to as a substrate processing portion. Wafer processing chamber 10 has wafer stage 12 disposed therein. Semiconductor wafer 110 may be placed on wafer stage 12.

A patterned silicon oxide film ($SiO_2$) is formed above the surface of semiconductor wafer 110. In this example, the silicon oxide film ($SiO_2$) is the etch target. Chemical liquid supplying portion 34 and a discharge port are disposed above wafer stage 12. The arrow extending from chemical liquid supplying portion 34 corresponds to the discharge port. Stage support portion 14 is provided below wafer stage 12. Stage support portion 14 is connected to a rotary mechanism not illustrated and is capable of rotating wafer stage 12 as well as semiconductor wafer 110 disposed on it.

Receiving portion 16 is disposed so as to surround the outer peripheral portion of wafer stage 12. The lower portion of receiving portion 16 is connected to piping 18 and is further connected to piping 24 and waste pipe 22 via branch 20. Receiving portion 16 is capable of receiving liquids such as chemical liquid 32 thrown off of the rotating semiconductor wafer 110 by centrifugal force.

Chemical liquid 32 received by receiving portion 16 is led to branch 20 via piping 18. Branch 20 is configured to select whether to route chemical liquid to piping 24 communicating with chemical liquid bath 30 or to waste pipe 22 for discharging used chemical liquid, etc. Chemical liquid bath 30 is a container for storing chemical liquid 32 and serves as a chemical liquid storing portion.

When a selection is made by branch 20 to route chemical liquid 32 to piping 24, chemical liquid 32 is fed through piping 18 and piping 24 and returned to chemical liquid bath 30. Then, chemical liquid 32 is fed to chemical liquid supplying portion 34 from chemical liquid bath 30 and supplied to semiconductor wafer 110. Chemical liquid 32 is cyclically used repeatedly as described above. The path to chemical liquid bath 30 via piping 18 and piping 24 and further to chemical liquid supplying portion 34 from chemical liquid bath 30 is one example of a cyclic route of chemical liquid 32 also referred to as a chemical liquid cycling portion.

When a selection is made by branch 20 to route chemical liquid 32 to waste pipe 22, the used chemical liquid 32 is exhausted as waste liquid through waste pipe 22. In this example, buffered hydrogen fluoride (BHF) solution is used as chemical liquid 32.

Semiconductor wafer 110 is placed on wafer stage 12 during the etch process. The etch process is enabled by discharging chemical liquid to the surface of semiconductor wafer 110 from the discharge port of chemical liquid supplying portion 34 located above semiconductor wafer 110.

During the etch process, semiconductor wafer 110 is either stopped or rotated at a rotation speed that causes semiconductor wafer 110 to be evenly covered by the chemical liquid so that semiconductor wafer 110 is soaked in the chemical liquid and allow progression of the etch process. After the lapse of a predetermined time period, the chemical liquid is thrown off of the surface of semiconductor wafer 110 by the centrifugal force produced by high-speed rotation of semiconductor wafer 110. Meanwhile, the used chemical liquid is led to flow through piping 24 by branch 20. Then, the surface of semiconductor wafer 110 is cleaned by supplying pure water to the surface of semiconductor wafer 110.

Wet etch apparatus 100 is provided with chemical liquid bath 30 and chemical liquid 32 is stored in chemical liquid bath 30. Piping 24 is connected to chemical liquid bath 30 and the chemical liquid used in the etch process is returned to chemical liquid bath 30 through piping 24. Thermometer 44 is connected to chemical liquid bath 30 via sampling line 40. Thermometer 44 is connected to CPU 42 via signal line 41. Thermometer 44 is configured to send the acquired temperature information of chemical liquid 32 to apparatus CPU 42 via signal line 41.

Chemical liquid bath 30 is connected to concentration monitor unit 64 via sampling line 62 and is configured to monitor the concentration of chemical liquid 32. Concentration monitor unit 64 is connected to apparatus CPU 42 via signal line 66 and sends data of chemical liquid concentration to apparatus CPU 42.

The inlet and the outlet of piping 38 are connected to chemical liquid bath 30 and temperature control portion 46 and pump 50 are disposed midway of piping 38. Temperature control portion 46 controls or makes adjustments in the temperature of chemical liquid 32 while chemical liquid 32 is passed through piping 38. Chemical liquid 32 subjected to temperature adjustment is returned to chemical liquid bath 30 by pump 50. Temperature of chemical liquid 32 in chemical liquid bath 30 is managed in the above described manner.

Tank 54 is provided with water supplying portion 36. Water supplying portion 36 and the discharge port are located above chemical liquid bath 30. It is thus, possible to supply water 56 inside tank 54 to chemical liquid bath 30. Water 56 is stored in tank 54. Water 56 may be pure water. Pump 52 is provided midway of water supplying portion 36 and it is possible to supply water 56 into chemical liquid bath 30 via water supplying portion 36.

Figure 2:
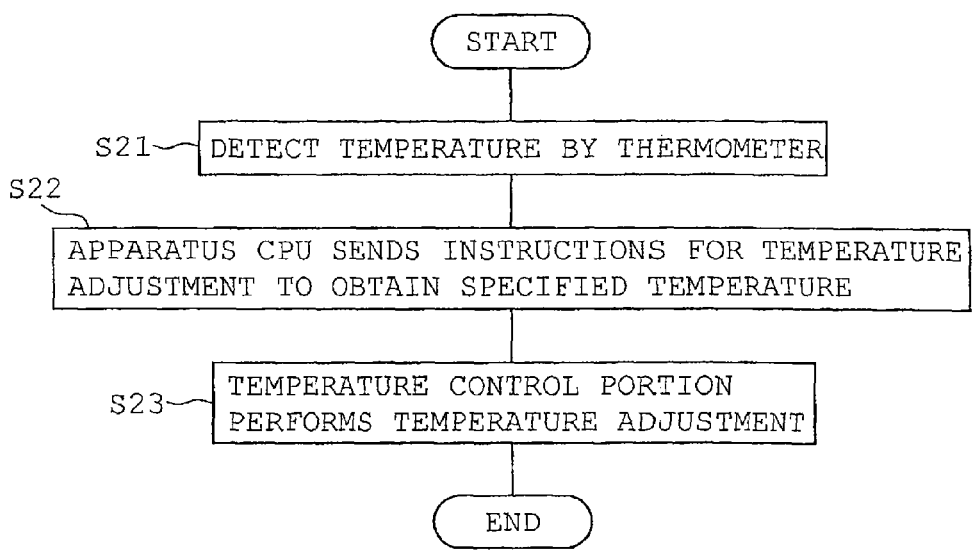
FIG. 2 is one example of a flowchart indicating the flow of temperature management of a chemical liquid bath.

FIG. 2 is a flowchart indicating one example of a flow of temperature management for the chemical liquid bath. Thermometer 44 detects or measures the temperature of chemical liquid 32 drawn in by sampling line 40 (step S21). Thermometer 44 transmits the values of temperature measurement to apparatus CPU 42 via signal line 41. Based on the transmitted temperature information, apparatus CPU 42 sends instructions to make adjustments in the temperature of chemical liquid 32 to temperature control portion 46 via control line 48 (step S22).

Then, temperature control portion 46 makes adjustments in the temperature of chemical liquid 32 cycling through piping 38 (step S23). Chemical liquid 32 being subjected to temperature adjustment is returned to chemical liquid bath 30. As a result, adjustment is made to the temperature of chemical liquid 32 stored in chemical liquid bath 30 so that chemical liquid 32 is controlled to the specified temperature.

Figure 3:
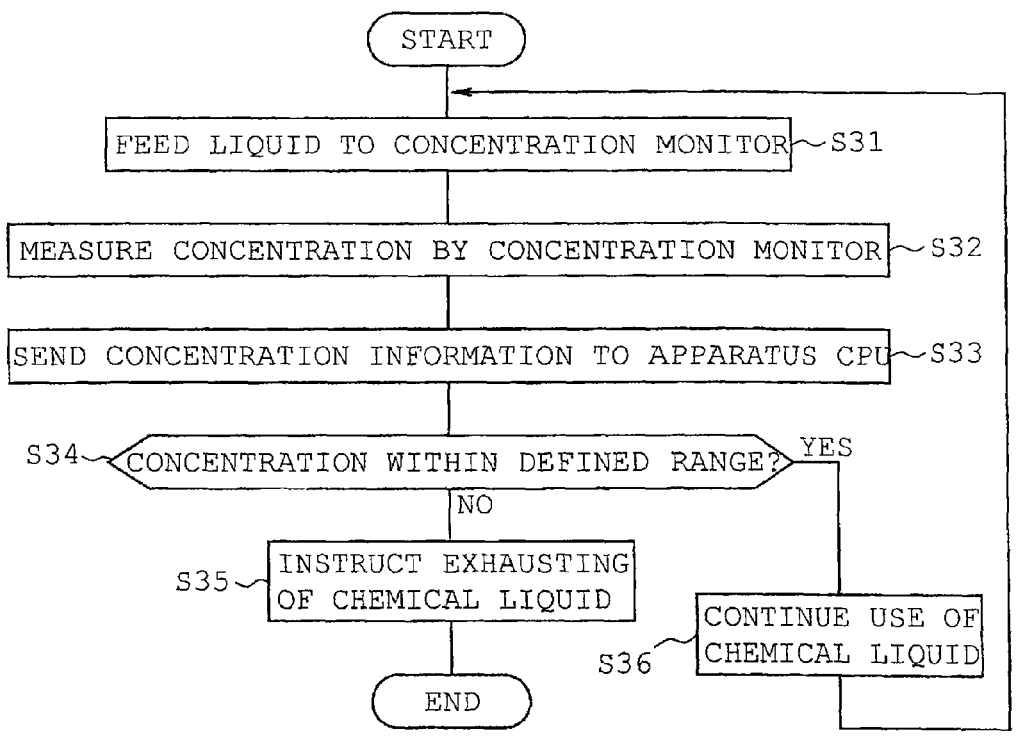
FIG. 3 is one example of a flowchart indicating the flow of waste discharge management of the chemical liquid bath.

FIG. 3 is a flowchart indicating one example of waste discharge management of chemical liquid 32. The first embodiment is described through an example in which the concentration of chemical liquid 32 is monitored in carrying out the waste discharge management of chemical liquid 32. Chemical liquid 32 is fed to concentration monitor unit 64 via sampling line 62 (step S31). The concentration of chemical liquid 32 is measured by concentration monitor unit 64 (step S32). The information on the concentration of chemical liquid 32 measured by concentration monitor unit 64 is transmitted to apparatus CPU 42 via signal line 66 (step S33). Concentration monitor unit 64 determines whether or not the concentration of chemical liquid 32 is within the defined range (step S34).

When the concentration of chemical liquid 32 is outside the defined range, instructions to exhaust chemical liquid 32 is given to valve 70 via control line 68 (step S35). On the other hand, when the concentration of chemical liquid 32 is within the defined range, it is determined that the use of chemical liquid may be continued (step S36) and instructions to exhaust chemical liquid 32 is not given to valve 70. The used chemical liquid 32 is returned to chemical liquid bath 30 through piping 24 and reused repeatedly.

Figure 4:
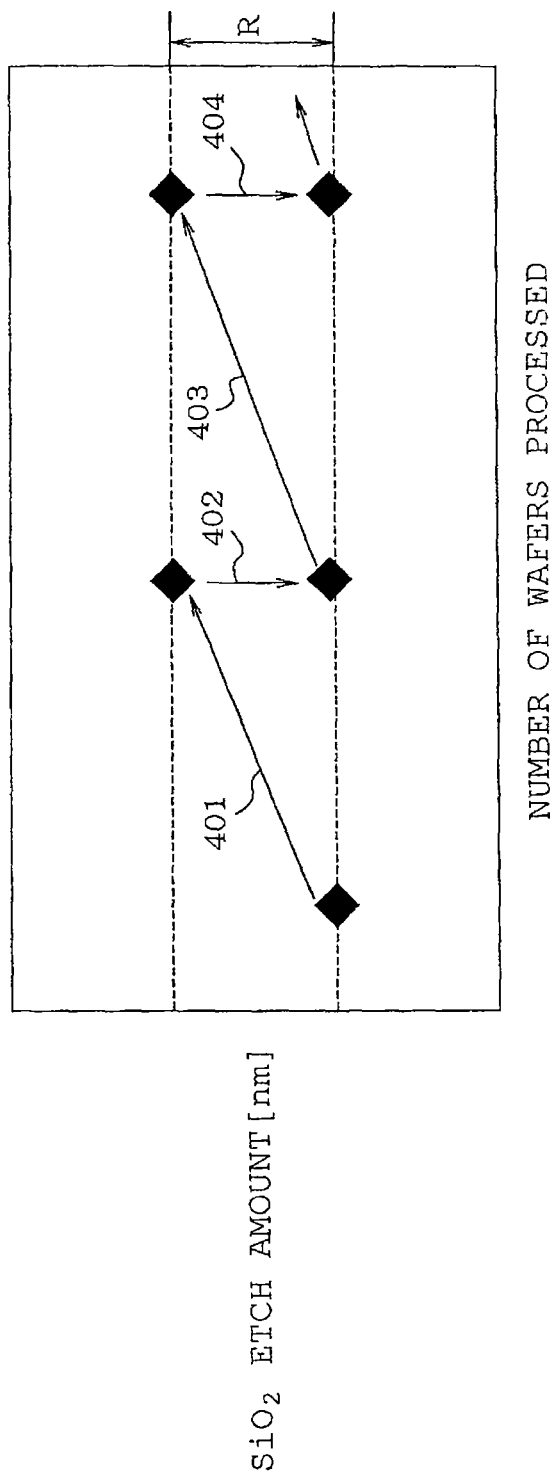
FIG. 4 pertains to the first embodiment and is a chart schematically indicating the variation in $SiO_2$ etch amount in a given period of time when wet etched with a chemical liquid.

FIG. 4 pertains to the first embodiment and is a chart schematically indicating the variation in the amount of $SiO_2$ etched within a given time period (etch rate) by chemical liquid 32. The lateral axis of the graph represents the number of semiconductor wafers 110 processed and the vertical axis of the graph represents the amount of $SiO_2$ etched within a given time period (etch rate). The amount of $SiO_2$ etched within a given time period (etch rate) increases with the increase in the number of semiconductor wafers 110 processed as indicated by arrow 401.

Next, when water is supplied to chemical liquid bath 30 from water supplying portion 36, the amount of $SiO_2$ etched within a given time period (etch rate) is reduced as indicated by arrow 402 and returns to the original etch amount. As more number of semiconductor wafers 110 are processed, the amount of $SiO_2$ etched within a given time period increases as indicated by arrow 403.

Next, when water is supplied to chemical liquid bath 30 from water supplying portion 36, the amount of $SiO_2$ etched within a given time period is reduced and returns approximately to the original etch amount (etch rate) as indicated by arrow 404.

The above described cycle is repeated hereinafter. In the present embodiment, it is possible to manage and control $SiO_2$ etch amount (etch rate) within a given time period by chemical liquid 32 to fall within a predetermined range in the above described manner.

As the concentration of chemical liquid 32 within chemical liquid bath 30 is reduced and falls outside the defined range, the amount of $SiO_2$ etched within a given time period decreases with increase in the number of wafers being processed. The amount of etched $SiO_2$ is further reduced when water is added to chemical liquid 32 in such state and thus, chemical liquid 32 is exhausted as waste (step S35 described above).

Figure 5:
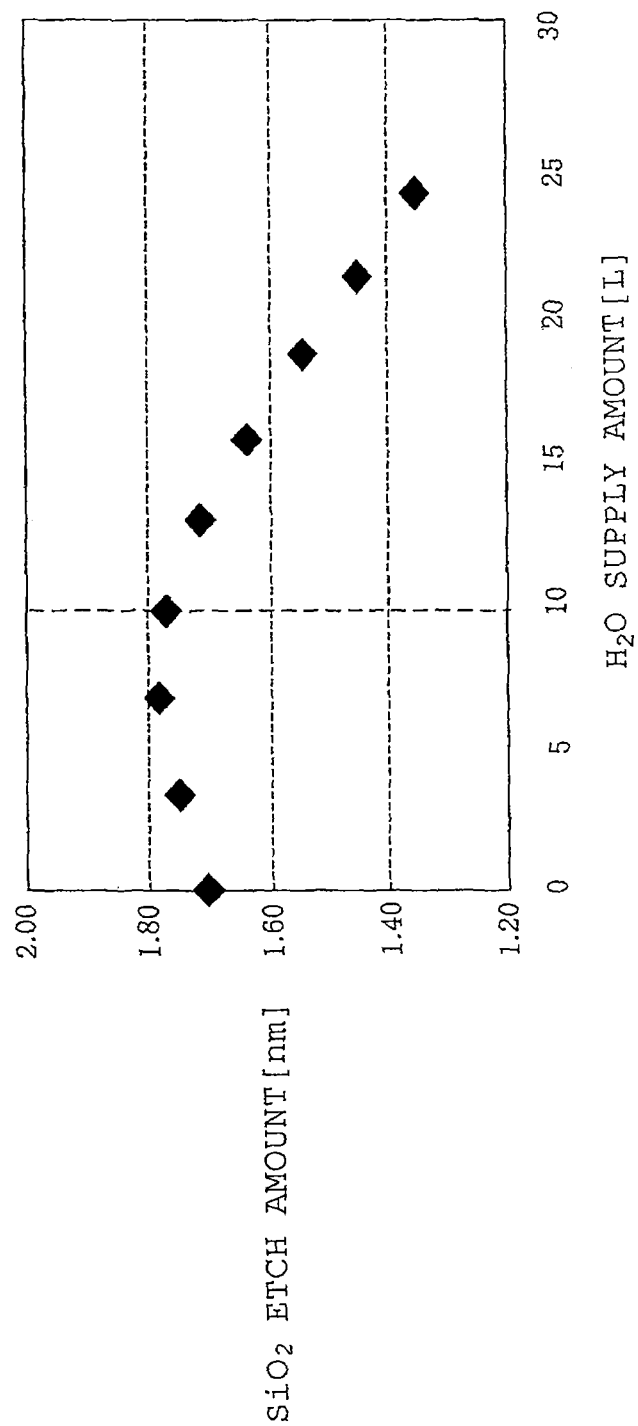
FIG. 5 pertains to the first embodiment and is one example of a graph indicating the variation in $SiO_2$ etch amount in a given period of time depending upon the amount of water added to the chemical liquid.

FIG. 5 pertains to the first embodiment and is one example of a graph indicating the variation in the amount of $SiO_2$ etched within a given time period by chemical liquid with respect to the amount of water added to the chemical liquid. The lateral axis represents the amount of water supply (L), the vertical axis represents the etch amount (nm) of $SiO_2$ within a given time period (20.0 sec). A buffered hydrogen fluoride solution is used for example as a chemical liquid. Water ($H_2O$) is added to the buffered hydrogen fluoride solution. The condition of buffered hydrogen fluoride solution before water is added is as described below.

| Concentration: | Buffered hydrogen fluoride (HF) | 0.25 wt % |
| --- | --- | --- |
|  | Ammonium fluoride ($NH_4F$) | 39.5 wt % |
| Chemical liquid temperature: | | 23.5 degrees Celsius |
| Chemical liquid amount: | | 20.0 L |

It can be understood from FIG. 5 that the amount of $SiO_2$ etched in a given time period is increased, meaning that etch rate becomes higher, as water is added. However, the amount of $SiO_2$ etched in a given time period starts to decrease when the added water amounts to 10 L as indicated by broken vertical line in FIG. 5. The concentration of buffered hydrogen fluoride in this state, hereinafter referred to as the first concentration, is as described below.

| First concentration: | hydrogen fluoride (HF) | 0.17 wt % |
| --- | --- | --- |
|  | ammonium fluoride ($NH_4F$) | 27.5 wt % |

Thus, it can be understood that the amount of $SiO_2$ etched in a given time period (etch rate) increases by adding water when the concentration of the buffered hydrogen fluoride is equal to or greater than the first concentration. Further, the amount of $SiO_2$ etched in a given time period (etch rate) decreases by adding water when the concentration of the buffered hydrogen fluoride is equal to or less than the first concentration. It is thus, possible to reduce the etch rate of the buffered hydrogen fluoride solution by adding water in the range of concentration equal to or less than the first concentration.

Figure 6:
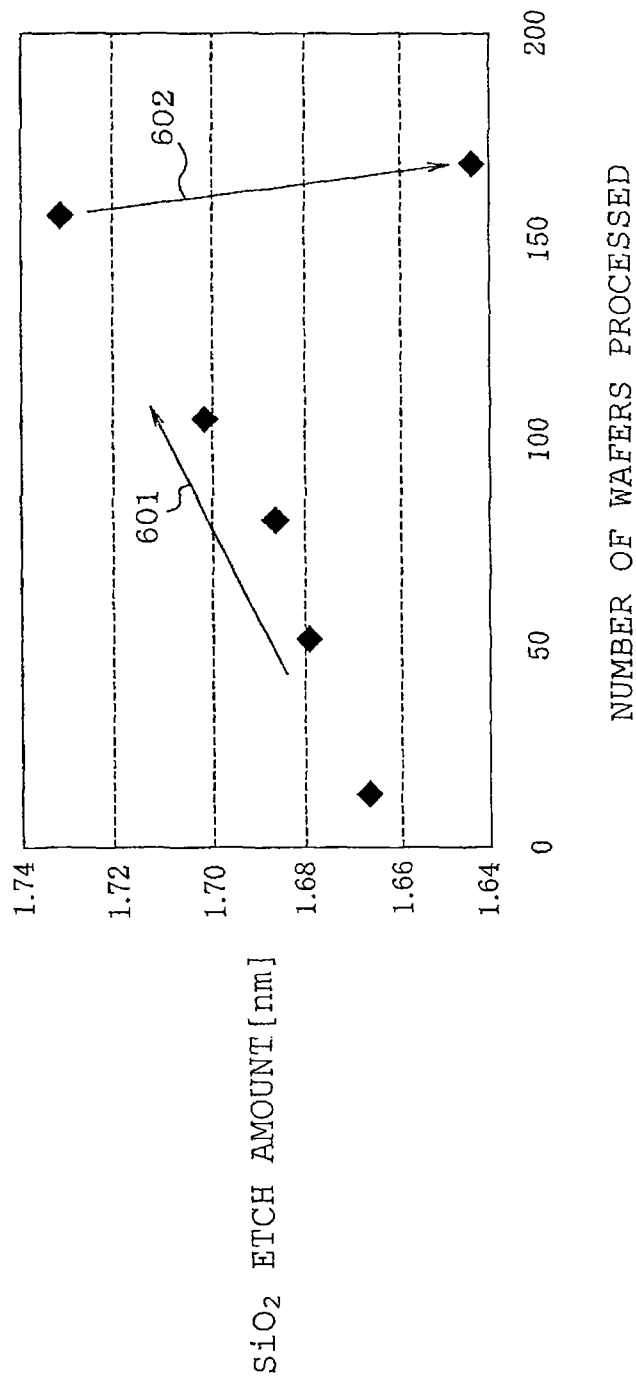
FIG. 6 pertains to the first embodiment and is one example of a graph indicating the variation in $SiO_2$ etch amount in a given period of time depending upon the number of wafers processed.

FIG. 6 pertains to the first embodiment and is one example of a graph indicating the variation of the amount of $SiO_2$ etched in a given time period with the number of wafers processed. The lateral axis represents the number of semiconductor wafers 110 processed and the vertical axis represents the amount (nm) of $SiO_2$ etched in a given time period.

Buffered hydrogen fluoride solution is used as chemical liquid 32. The condition of the buffered hydrogen fluoride solution before semiconductor wafer 110 processing is started and the time expended on processing one semiconductor wafer 110 is as follows. A silicon oxide film is formed above the surface of semiconductor wafer 110 and the silicon oxide film is etched by the buffered hydrogen fluoride solution.

| Concentration: | hydrogen fluoride (HF) | 0.16 wt % |
| --- | --- | --- |
|  | ammonium fluoride ($NH_4F$) | 25.0 wt % |
| Chemical liquid temperature: | | 23.5 degrees Celsius |
| Amount of chemical liquid: | | 11.0 L |
| Processing time: | | 20.0 sec |

The above described concentration of chemical liquid is equal to or less than the first concentration. As indicated by arrow 601 in FIG. 6, the amount of $SiO_2$ etched in a given time period increases as the number of semiconductor wafers 110 processed is increased. The amount of $SiO_2$ etched in a given time period, in other words, the etch rate decreases when water is added after 150 semiconductor wafers 110 are processed as indicated by arrow 602. The amount of water added at this instance is 3 L for example.

It can be understood from the foregoing that the etch rate increases as the number of wafers processed increases when semiconductor wafer 110 having a silicon oxide film formed above the surface thereof is processed by a buffered hydrogen fluoride solution having a concentration equal to or less than the first concentration under the above described conditions. It can be further understood that the etch rate decreases by adding water. In other words, the etch rate of the chemical liquid (buffered hydrogen fluoride solution) increased by being used in processing semiconductor wafer 110 can be returned (lowered) to the original level by adding water. FIG. 4 described earlier indicates the repetition of this cycle.

Figure 7:
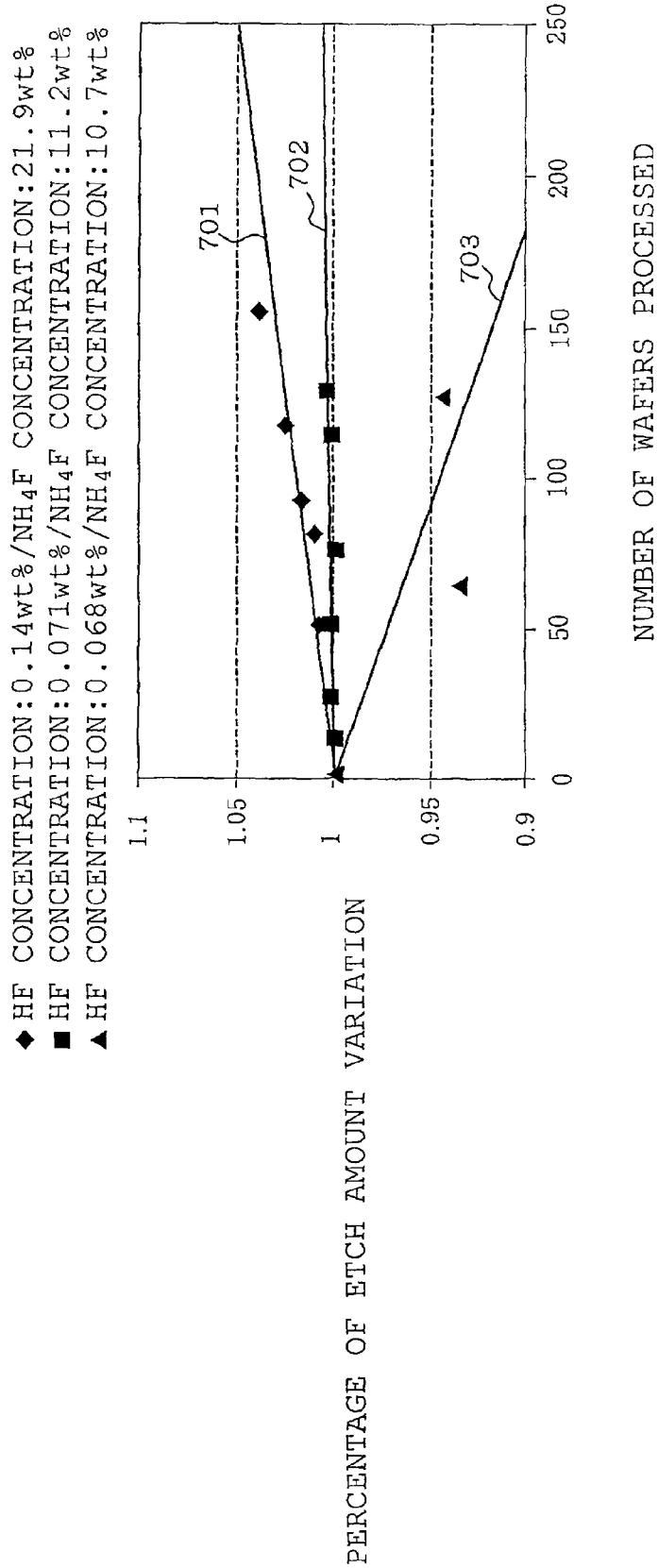
FIG. 7 pertains to the first embodiment and is one example of a graph indicating the percentage of variation in $SiO_2$ etch amount in a given period of time depending upon the number of wafers processed.

FIG. 7 pertains to the first embodiment and is one example of a graph indicating the percentage of variation in the amount of $SiO_2$ etched in a given time period (etch rate) with respect to the number of wafers processed using different chemical liquid concentrations. In the graph, the lateral axis represents the number of semiconductor wafers 110 processed and the vertical axis represents the amount (nm) of $SiO_2$ etched in a given time period.

Buffered hydrogen fluoride solution is used as chemical liquid 32. The concentrations of the buffered hydrogen fluoride solutions, namely the first solution, the second solution, and the third solution before semiconductor wafer 110 processing is started are as follows. In the first, the second, and the third solutions, the chemical liquid temperature is 23.5 degrees Celsius, the chemical liquid amount (before processing) is 11.0 L, and the processing time per wafer is 20.0 sec. A silicon oxide film is formed above the surface of semiconductor wafer 110 and the silicon oxide film is etched by the buffered hydrogen fluoride solution. The concentration of each of the first, the second, and the third solution is equal to or less than the first concentration.

| First solution: Graph line 701 (♦) | | |
|---|---|---|
| Concentration: | hydrogen fluoride (HF) | 0.14 wt % |
| | ammonium fluoride (NH₄F) | 21.9 wt % |
| Second solution: Graph line 702 (■) | | |
| Concentration: | hydrogen fluoride (HF) | 0.071 wt % |
| | ammonium fluoride (NH₄F) | 11.2 wt % |
| Third solution: Graph line 703 (▲) | | |
| Concentration: | hydrogen fluoride (HF) | 0.068 wt % |
| | ammonium fluoride (NH₄F) | 10.7 wt % |

The amount of $SiO_2$ etched in a given time period (etch rate) when semiconductor wafer 110 is processed using the first solution is indicated by graph line 701. As indicated by graph line 701, the amount of $SiO_2$ etched in a given time period increases as the number of semiconductor wafers 110 processed is increased when semiconductor wafer 110 is processed using the first solution. The concentration of the first solution is equal to or less than the first concentration. Thus, when the amount of $SiO_2$ etched in a given time period increases as the number of semiconductor wafers 110 processed is increased as is the case when the first solution is used, the etch rate can be lowered and returned to the original level by adding water.

The amount of $SiO_2$ etched in a given time period (etch rate) when semiconductor wafer 110 is processed using the second solution is indicated by graph line 702. As indicated by graph line 702, no significant change is observed in the amount of $SiO_2$ etched in a given time period and stays substantially constant even when the number of semiconductor wafers 110 processed is increased when semiconductor wafer 110 is processed using the second solution. The concentration of the second solution is equal to or less than the first concentration. However, since the etch rate is substantially constant even when the number of semiconductor wafers 110 processed is increased, there is no need to make adjustments in the etch rate by adding water. Thus, it is possible to keep using the second solution in the subsequent processes.

The amount of $SiO_2$ etched in a given time period (etch rate) when semiconductor wafer 110 is processed using the third solution is indicated by graph line 703. As indicated by graph line 703, the etch rate decreases as the number of semiconductor wafers 110 processed is increased when semiconductor wafer 110 is processed using the third solution. Thus, it is not possible to lower the etch rate and return the etch rate to the original level by adding water. The change in the etch rate caused by the increase in the number of semiconductor wafers 110 processed cannot be returned to the original level by adding water when the third solution having the above described concentration is used.

It can be understood from the above described experiments that a chemical liquid having a concentration approximately equal to or greater than the concentration of the second solution (hereinafter referred to as a second solution) is required to return the change in the etch rate caused by the increase in the number of semiconductor wafers 110 processed by adding water. It is thus, not possible to use the third solution having the above described concentration as the chemical liquid of the first embodiment.

As described above, it is possible to keep the etch rate of the chemical liquid that varies depending upon the number of wafers processed within a predetermined range by adding water when the chemical liquid comprises a buffered hydrogen fluoride solution having a concentration equal to or less than the first concentration or equal to or greater than the second concentration.

A description will be given hereinafter on chemical reactions taking place in the chemical liquid comprising buffered hydrogen fluoride solution and the behavior of the chemical liquid when water is added.

The reactions taking place in the buffered hydrogen fluoride solution and the behavior of the buffered hydrogen fluoride when water is added are expressed by the following formulae.

$$NH_4F \rightarrow NH_4^+ + F^- \quad (1)$$

$$NH_4^+ \Leftrightarrow NH_3 + H^+ \quad (2)$$

$$HF \Leftrightarrow H^+ + F^- \quad (3)$$

$$HF + F^- \Leftrightarrow HF_2^- \quad (4)$$

$$SiO_2 + 2HF_2^- + 2H^+ \rightarrow SiF_4 + 2H_2O \quad (5)$$

Buffered hydrogen fluoride solution is a mixed solution containing fluoric acid (hydrogen fluoride, HF) and ammonium fluoride ($NH_4F$) which may further contain additives such as a surfactant. It is possible to make adjustments in the etch rate of buffered hydrogen fluoride by controlling the mixture ratio of hydrogen fluoride and ammonium fluoride.

First, a description will be given on a case in which the concentration of ammonium fluoride ($NH_4F$) is high, ranging from 27.5 wt % to 39.5 wt %. In this case, the following reaction occurs in the solution.

In formula (1), ammonium fluoride ($NH_4F$) is a salt of hydrogen fluoride and ammonium and thus, most of it is dissociated into ammonium ion ($NH_4^+$) and fluoride ion ($F^-$) in the solution. Because the concentration of ammonium fluoride is high in this case, large amount of ammonium ion is produced by the disassociation.

The chemical equilibrium leans toward the right in formula (2) since a large amount of ammonium ion exists, meaning that the concentration of ammonium ion is high. As a result, large amounts of ammonia ($NH_3$) and hydrogen ion ($H^+$) are produced. Ammonia, being volatile, evaporates from the solution and thus, ammonia concentration is reduced with lapse of time. The chemical equilibrium of formula (2) leans further toward the right as the concentration of ammonia becomes lower, resulting in further increase in hydrogen ion ($H^+$).

Because a large amount of hydrogen ion ($H^+$) is produced, the chemical equilibrium of formula (3) leans toward the left to produce a large amount of undissociated hydrogen fluoride (HF). Because a large amount of hydrogen fluoride is produced, the chemical equilibrium of formula (4) leans toward the right to produce a large amount of $HF_2^-$.

When water is added to the solution, the amount of evaporated ammonia stays substantially the same since the solution originally contains large amount of ammonia. The chemical equilibrium of formula (2) stays substantially unchanged and thus, keeps leaning toward the right to produce large amount of hydrogen ion ($H^+$), resulting in an increase in hydrogen ion index pH. Thus, the chemical equilibrium of formula (3) leans toward the left and the chemical equilibrium of formula (4) leans toward the right to increase the amount of $HF_2^-$.

The reaction of hydrogen fluoride and silicon oxide film ($SiO_2$) is represented by formula (5). The ion responsible for reacting with $SiO_2$ is $HF_2^-$. Thus, the solution in which a large amount of $HF_2^-$ is produced will have increased etch rate with respect to the silicon oxide film. That is, when the concentration of ammonium fluoride ($NH_4F$) ranges from 27.5 wt % to 39.5 wt %, the etch rate with respect to the silicon oxide film is increased by adding water. Further, because a large amount of ammonium evaporates in this concentration range, the amount of $HF_2^-$ is increased to thereby increase the etch rate with respect to the silicon oxide film.

Next, a description is given on a case in which the concentration of ammonium fluoride ($NH_4F$) ranges from 11.2 wt % to 27.5 wt %. In this case, the solution is diluted when water is added since the concentration of ammonium fluoride ($NH_4F$) is low, making it difficult for the chemical equilibrium of formula (2) to lean toward the right. As a result, the concentration of ammonia is reduced, making it difficult for ammonia to evaporate. Thus, no significant decrease in the amount of ammonia is observed in the solution, making it difficult for the chemical equilibrium of formula (3) to lean toward the left and the chemical equilibrium of formula (4) to lean toward the right. As a result, the concentration of $HF_2^-$ is reduced to reduce the etch rate of the solution. That is, when the concentration of ammonium fluoride ($NH_4F$) ranges from 11.2 wt % to 27.5 wt %, the etch rate with respect to the silicon oxide film is reduced by adding water. The first embodiment employs the buffered hydrogen fluoride falling within this concentration range.

The configuration and effect of the first embodiment may be summarized as follows.

The solution of the first embodiment employs a buffered hydrogen fluoride solution having a concentration equal to or less than the first concentration and equal to or greater than the second concentration. The use of solution falling within the above described range of concentration allows the etch rate varying with the increase in the number of wafers processed to be confined within a predetermined range by adding water. It is possible to reduce the management cost of the etching solution because water is used.

The first concentration denotes 0.17 wt % of hydrogen fluoride (HF) and 27.5 wt % of ammonium fluoride ($NH_4F$). The second concentration denotes 0.071 wt % of hydrogen fluoride (HF) and 11.2 wt % of ammonium fluoride ($NH_4F$).

Figure 8A:
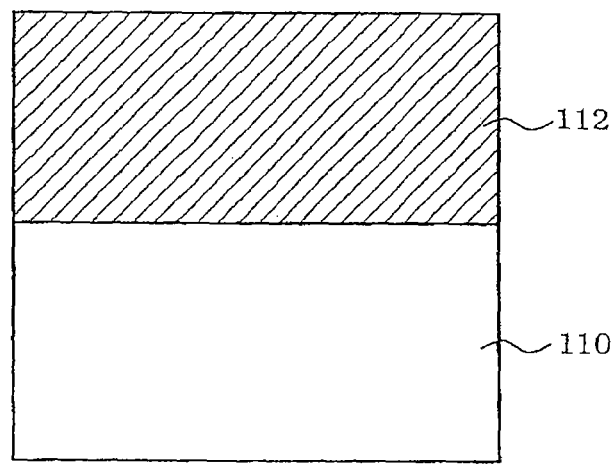
FIGS. 8A, 8B, and 8C pertain to the first embodiment and are examples of vertical cross-sectional views schematically illustrating a method of manufacturing a semiconductor device using the chemical liquid.
Figure 8B:
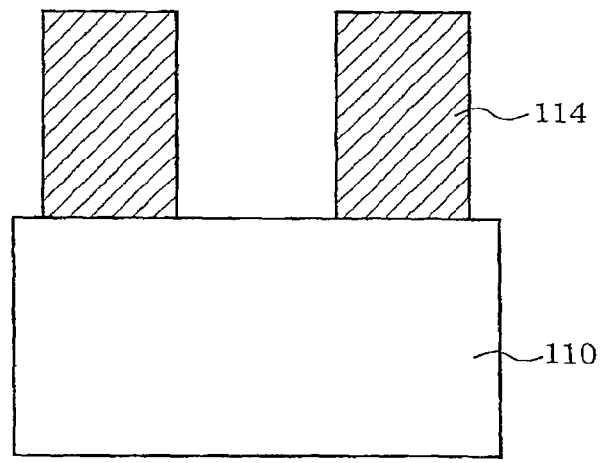
Figure 8C:
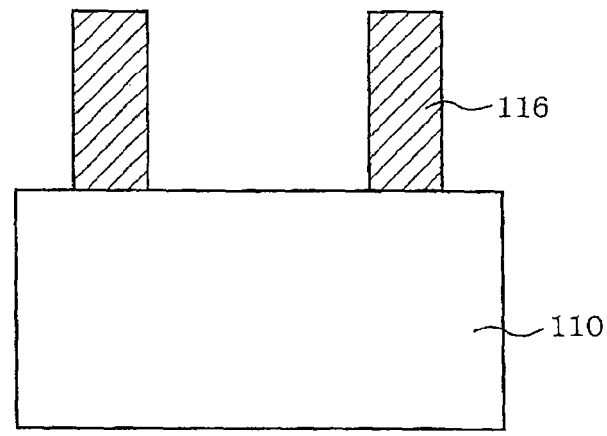

FIGS. 8A, 8B, and 8C pertain to the first embodiment and are vertical cross-sectional views schematically illustrating a method of manufacturing a semiconductor device using chemical liquid 32 which are arranged according to the manufacturing process flow. Referring first to FIG. 8A, silicon oxide film 112 is formed above semiconductor wafer 110. A silicon substrate may be used for example as semiconductor wafer 110. A silicon substrate having various types of insulating films and conductive films formed thereabove may be used as semiconductor wafer 110. Silicon oxide film 112 may be formed for example by thermal oxidation or by CVD (Chemical Vapor Deposition).

Referring next to FIG. 8B, silicon oxide film 112 is processed using lithography and RIE (Reactive Ion Etching) to form a first pattern 114.

Referring next to FIG. 8C, isotropic etching is performed using chemical liquid 32 (buffered hydrogen fluoride solution) of the first embodiment for slimming first pattern 114 and thereby obtaining second pattern 116 which is reduced in size compared to first pattern 114.

The semiconductor device of the first embodiment is formed by the above described process flow. Second pattern 116 may be used for example as a mandrel in double patterning.

When the first pattern 114 or second pattern 116 is processed in the order of several tens of nm for example, precision required in the slimming is approximately several nm or less for example. Thus, chemical liquid 32 is used in an environment that requires significantly low and stable etch rate in which the variation in the etch rate needs to be suppressed as much as possible. However, replacing chemical liquid 32 for every new semiconductor wafer 110 being processed will increase the manufacturing cost. Adding supplementary chemical liquid to chemical liquid 32 will also be expensive. In contrast, the first embodiment keeps the etch rate varying with the increase in the number of wafers processed within a predetermined range by simply adding water. This will significantly reduce the cost required in etch rate management. In summary, the first embodiment allows simplified and low cost management of etch rate.

Second Embodiment

Figure 9:
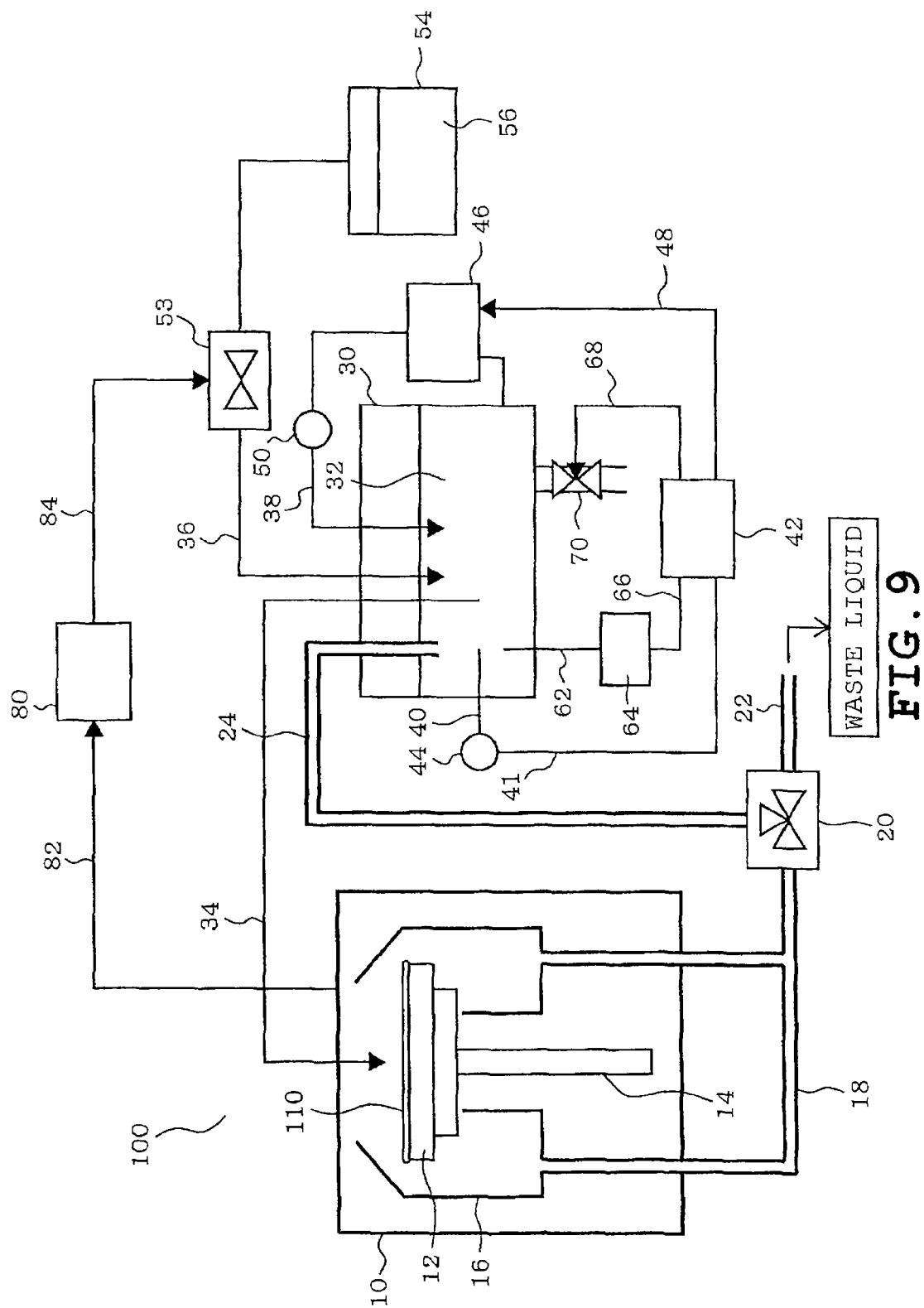
FIG. 9 pertains to a second embodiment and is one example of a block diagram illustrating a wet etch apparatus which is one example of a semiconductor manufacturing apparatus.

FIG. 9 illustrates one example of a block diagram illustrating the structures of a wet etch apparatus which is one example of a semiconductor manufacturing device of a second embodiment. Differences of the wet etch apparatus of the second embodiment from wet etch apparatus 100 of the first embodiment are described below.

Wet etch apparatus 100 of the first embodiment uses pump 52 to transfer water 56 from tank 54 to chemical liquid bath 30. Wet etch apparatus 100 of the second embodiment uses flow rate adjustment valve 53 instead of pump 52. Flow rate adjustment valve 53 is controlled by apparatus CPU 80. Apparatus CPU 80 acquires process information such as the number of semiconductor wafers 110 processed, the amount of chemical liquid 32 used, and the like in wafer processing chamber 10 by way of signal line 82. Wafer processing chamber 10 stores the process information such as the number of semiconductor wafers 110 processed and the amount of chemical liquid 32 used, and apparatus CPU 80 acquires such process information. Upon acquiring the process information, apparatus CPU 80 controls flow rate adjustment valve 53 and feeds an appropriate amount of water 56 to be added to water supplying portion 36. Apparatus CPU 80 and apparatus CPU 42 are illustrated as separate devices in the figures. However, apparatus CPU 80 may be integrated into apparatus CPU 42 instead of being provided as separate devices in which case apparatus CPU 42 executes the functionalities of apparatus CPU 80.

Figure 10:
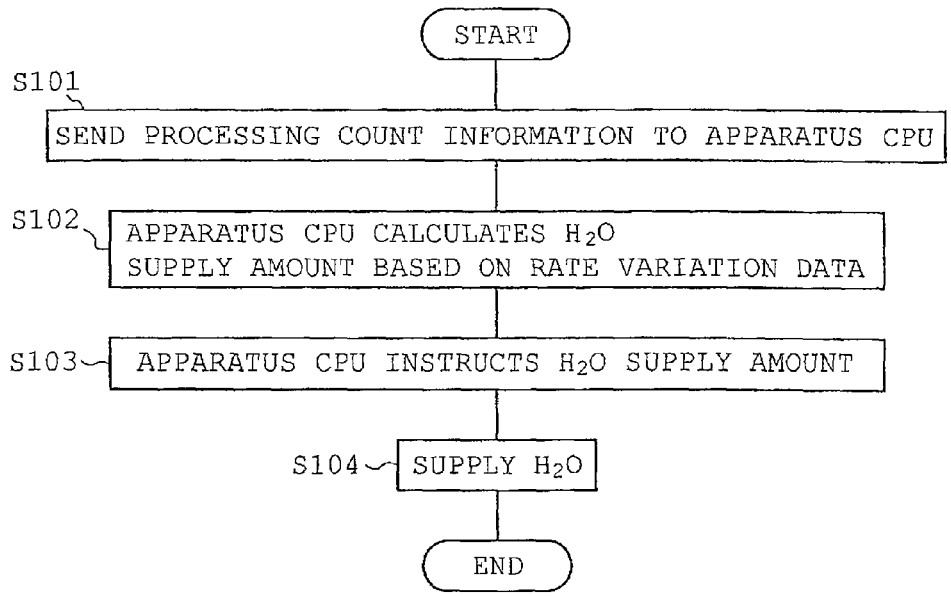
FIG. 10 pertains to a second embodiment and is one example of a flowchart indicating the flow of chemical liquid management in which the amount of water being added is determined based on the number of semiconductor wafers processed.
Figure 11:
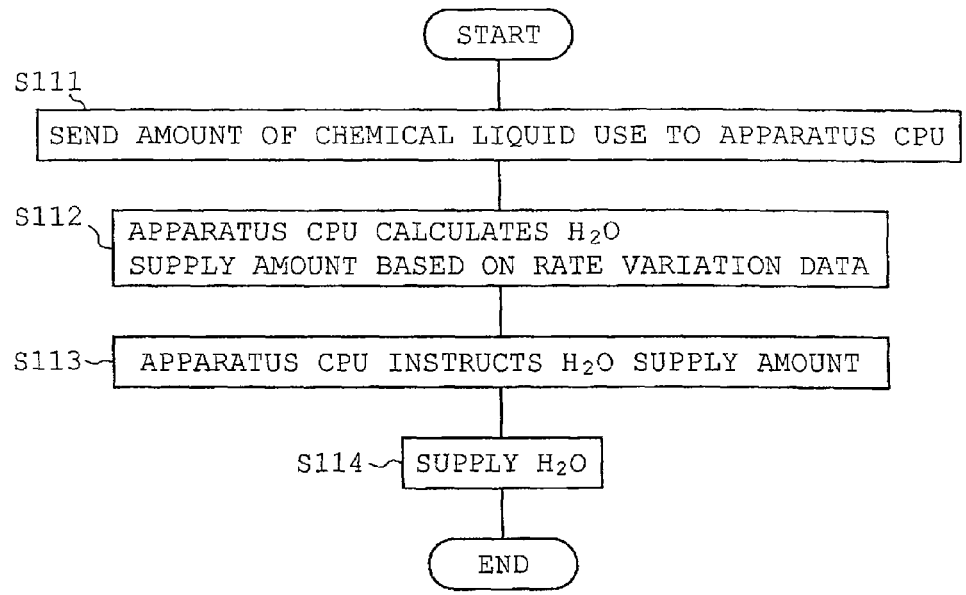
FIG. 11 pertains to a second embodiment and is one example of a flowchart indicating the flow of chemical liquid management in which the amount of water being added is determined based on the amount of chemical liquid used in processing the semiconductor wafers.

FIG. 10 and FIG. 11 indicate examples of chemical liquid management flows of the second embodiment. FIG. 10 indicates one example of a control flow for determining the amount of water 56 to be added based on the number of semiconductor wafers 110 processed. As indicated in FIG. 10, information on the number of semiconductor wafers 110 processed is sent from wafer processing chamber 10 to apparatus CPU 80 (step S101). Apparatus CPU 80 stores data (rate variation data) indicating the degree of variation in the etch rate of chemical liquid 32 depending upon the variation in the number of wafers 110 processed. Apparatus CPU 80 calculates the amount of water 56 to be supplied by referring to the rate variation data (step S102). Apparatus CPU 80 transmits instructions on the amount of water 56 to be supplied to flow rate adjustment valve 53 (step S103). Flow rate adjustment valve 53 makes adjustments in the degree of openness of the valve based on the instructions given and supplies the instructed amount of water 56 (step S104).

It is thus, possible to suppress the variation in the etch rate of chemical liquid 32 and maintain the etch rate within a predetermined range.

FIG. 11 indicates one example of a control flow for determining the amount of water 56 to be added based on the amount of chemical liquid 32 used in processing semiconductor wafer 110. As indicated in FIG. 11, information on the amount of chemical liquid 32 used is inputted from wafer processing chamber 10 to apparatus CPU 80 (step S111). Apparatus CPU 80 pre-stores data (rate variation data) indicating the degree of variation in the etch rate of chemical liquid 32 depending upon the variation in the amount of chemical liquid 32 used. Apparatus CPU 80 calculates the amount of water 56 to be supplied by referring to the rate variation data (step S112). Apparatus CPU 80 sends instructions on the amount of water 56 to be supplied to flow rate adjustment valve 53 (step S113). Flow rate adjustment valve 53 makes adjustments in the degree of openness of the valve based on the instructions and supplies the instructed amount of water 56 (step S114).

It is thus, possible to suppress the variation in the etch rate of chemical liquid 32 and maintain the etch rate within a predetermined range.

Third Embodiment

Figure 12:
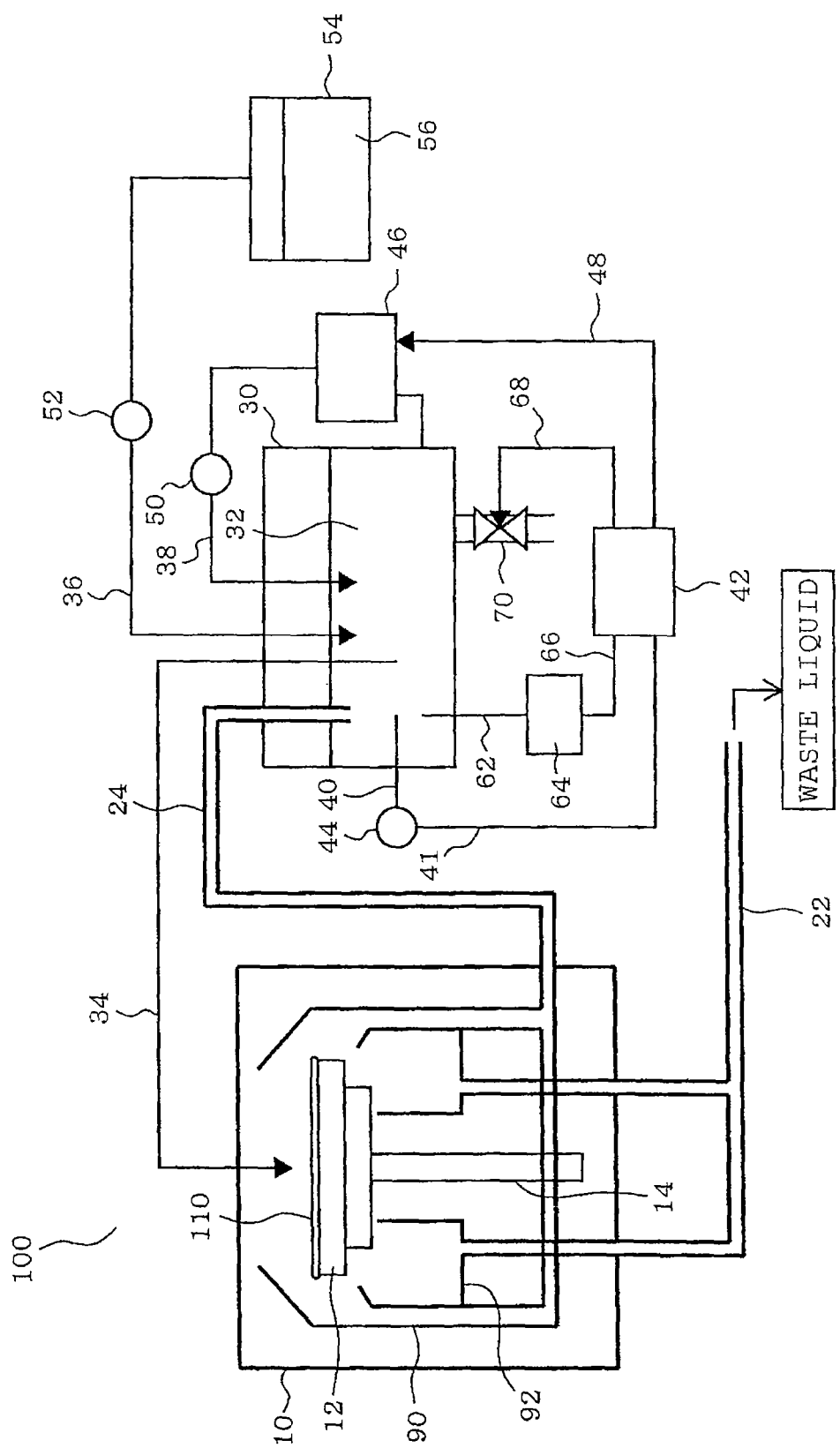
FIG. 12 pertains to a third embodiment and is one example of a block diagram illustrating a wet etch apparatus which is one example of a semiconductor manufacturing apparatus.

FIG. 12 illustrates one example of a block diagram illustrating the structures of a wet etch apparatus which is one example of a semiconductor manufacturing device of a third embodiment. Differences of the wet etch apparatus of the third embodiment from wet etch apparatus 100 of the first embodiment are described below.

In the first embodiment, wafer processing chamber 10 is provided with receiving portion 16 disposed so as to surround wafer stage 12. The used chemical liquid 32 received by receiving portion 16 is led to branch 20 by piping 18 and selectively routed to either waste pipe 22 or piping 24. Wet etch apparatus 100 of the third embodiment is provided with first receiving portion 90 and second receiving portion 92 instead of receiving portion 16. First receiving portion 90 and second receiving portion 92 are configured to receive the used chemical liquid 32. First receiving portion 90 is connected to piping 24 going back to chemical liquid bath 30. Chemical liquid 32 received by first receiving portion 90 is returned to chemical liquid bath 30 by way of piping 24. Second receiving portion 92 is connected to waste pipe 22. Chemical liquid 32 received by second receiving portion 92 is discharged as a waste liquid by way of waste pipe 22.

It is possible to switch whether to receive the used chemical liquid 32 pouring off of the edge of semiconductor wafer 110 with first receiving portion 90 or second receiving portion 92 by for example moving first receiving portion 90 up and down to change the position of first receiving portion 90 with respect to the edge of semiconductor wafer 110. Similar switching in the relative positioning of first receiving portion 90 with respect to the edge of semiconductor wafer 110 may be made by moving stage support portion 14 up and down.

For example, if the concentration of chemical liquid 32 is barely within the prescribed range of concentration, meaning that it is soon expected to fall outside the prescribed range, the used chemical liquid 32 may be treated as a waste liquid via second receiving portion 92 and waste pipe 22 without being returned to chemical liquid bath 30.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device comprising:
processing a plurality of substrates each provided with an etch target by using a chemical liquid, the chemical liquid used repeatedly and being mixed with water for adjustment of an etch rate,
wherein the chemical liquid comprises a buffered hydrogen fluoride containing 0.17 wt % to 0.071 wt % of hydrogen fluoride and 27.5 wt % to 11.2 wt % of ammonium fluoride.

2. The method according to claim 1, wherein the etch rate of the chemical liquid is reduced by being mixed with water.

3. The method according to claim 1, wherein the etch target comprises a silicon oxide film.

4. The method according to claim 1, wherein an amount of water being mixed with the chemical liquid is calculated based on a number of substrates processed.

5. The method according to claim 1, wherein an amount of water being mixed with the chemical liquid is calculated based on an amount of the chemical liquid used.

6. A method of manufacturing a semiconductor device comprising:
processing a plurality of substrates each provided with an etch target by using a chemical liquid, the chemical liquid used repeatedly and being mixed with water for adjustment of an etch rate,
wherein the chemical liquid comprises a buffered hydrogen fluoride and is used cyclically when containing 0.17 wt % to 0.071 wt % of hydrogen fluoride and 27.5 wt % to 11.2 wt % of ammonium fluoride.

7. The method according to claim 6, wherein the etch rate of the chemical liquid is reduced by being mixed with water.

8. The method according to claim 6, wherein the etch target comprises a silicon oxide film.

9. The method according to claim 6, wherein an amount of water being mixed with the chemical liquid is calculated based on a number of substrates processed.

10. The method according to claim 6, wherein an amount of water being mixed with the chemical liquid is calculated based on an amount of the chemical liquid used.

11. A method of manufacturing a semiconductor device comprising:
processing a plurality of substrates each provided with an etch target by using a chemical liquid, the chemical liquid used repeatedly and being mixed with water for adjustment of an etch rate,
wherein the chemical liquid comprises a buffered hydrogen fluoride and is exhausted as waste when containing less than 0.071 wt % of hydrogen fluoride and less than 11.2 wt % of ammonium fluoride.

12. The method according to claim 11, wherein the etch rate of the chemical liquid is reduced by being mixed with water.

13. The method according to claim 11, wherein the etch target comprises a silicon oxide film.

14. The method according to claim 11, wherein an amount of water being mixed with the chemical liquid is calculated based on a number of substrates processed.

15. The method according to claim 11, wherein an amount of water being mixed with the chemical liquid is calculated based on an amount of the chemical liquid used.

* * * * *